United States Patent
Cross et al.

(10) Patent No.: US 7,351,604 B2
(45) Date of Patent: Apr. 1, 2008

(54) MICROSTRUCTURES

(75) Inventors: Graham Cross, Dublin (IE); Michel Despont, Adliswil (CH); Urs T. Duerig, Rueschlikon (CH); Grégoire Genolet, Martigny (CH); Reto Schlittler, Schoenenberg (CH); Peter Vettiger, Langnau am Albis (CH)

(73) Assignee: International Business Machines Corporation, Armonk, NY (US)

( * ) Notice: Subject to any disclaimer, the term of this patent is extended or adjusted under 35 U.S.C. 154(b) by 292 days.

(21) Appl. No.: 10/501,516

(22) PCT Filed: Nov. 21, 2002

(86) PCT No.: PCT/IB02/04853

§ 371 (c)(1),
(2), (4) Date: Jul. 14, 2004

(87) PCT Pub. No.: WO03/060923

PCT Pub. Date: Jul. 24, 2003

(65) Prior Publication Data

US 2005/0130551 A1 Jun. 16, 2005

(30) Foreign Application Priority Data

Jan. 15, 2002 (EP) .................. 02405021

(51) Int. Cl.
*H01L 21/00* (2006.01)

(52) U.S. Cl. .................. 438/52; 438/53; 977/732; 977/733

(58) Field of Classification Search ............... 438/29, 438/39, 49–50, 52–53, 83; 977/724, 732–737
See application file for complete search history.

(56) References Cited

U.S. PATENT DOCUMENTS

| 5,773,921 | A | 6/1998 | Keesmann et al. |
| 5,994,160 | A * | 11/1999 | Niedermann et al. ......... 438/53 |
| 6,340,822 | B1 * | 1/2002 | Brown et al. .................. 257/25 |
| 2002/0102201 | A1 * | 8/2002 | Colbert et al. ........... 423/445 R |
| 2002/0130610 | A1 * | 9/2002 | Gimzewski et al. ........ 313/495 |

FOREIGN PATENT DOCUMENTS

WO   WO 00/19494   4/2000

OTHER PUBLICATIONS

Search Report from corresponding PCT Application No. PCT/IB02/04853.
Vettiger, p. et al. "The Millipede-more than one thousand tips for future AFM data storage." IBM Journal of Research and Development, IBM Corporation, Armonk, US, vo. 44, No. 3, May 2000 (2000-02), pp. 323-340, XP002194187, ISSN: 0018-8646.

* cited by examiner

*Primary Examiner*—Thanhha S. Pham
(74) *Attorney, Agent, or Firm*—F. Chau & Associates, LLC

(57) ABSTRACT

A method for forming a microstructures is described. The method comprises: depositing a seed material on a substrate; growing a nanotube from the seed material; depositing microstructure material on the substrate to embed the nanotube in the microstructure material; and, detaching the substrate to release the microstructure. The resulting mictostructure comprises a body portion and a nanotube embedded in the body portion.

26 Claims, 6 Drawing Sheets

MICROSTRUCTURES

FIELD OF THE INVENTION

The present invention generally relate to microstructures and particularly relates to microstructures incorporating carbon nanotube tips for applications including microscopy and data storage.

BACKGROUND OF THE INVENTION

Atomic Force Microscopy (AFM) is a well known form of Scanning Probe Microscopy (SPM). AFM is conventionally employed in range of surface imaging, nanometer scale analysis and manipulation applications. Imaging is achieved via AFM by detecting forces occurring between a sensor in form of a tip at one end of a cantilever and a sample to be imaged. The tip and cantilever in combination will be herein after referred to as a tip assembly in the interests of convenience. The tip is a relatively reliable tool for providing highly localized confinement of interaction. This property has opened up a range of applications in the nanotechnology field. For example, in "The "Millipede"—More than one thousand tips for future AFM data storage", P. Vettiger et al, IBM Journal of Research and Development. Vol.44 No.3, May 2000, there is described a data storage device based on AFM probe technology providing smaller form factor, higher capacity, lower power, and lower cost than conventional memory devices. The storage density achievable in such a storage device depends on the durability and quality of the tip. It would therefore be desirable to provide such tips with optimal durability and quality via a cost effective process. It would also be desirable to produce highly integrated arrays of such sensors.

In a conventional AFM instrument, the tip assembly, which is responsible for the spatial resolution of the instrument, contributes a significant portion of the total cost of ownership (TC0) of the instrument. The cantilever of the tip assembly is typically hand-fabricated or batch microfabricated cantilever. In situ within the instrument, one end of the cantilever is fixed and the other remains free. The tip is located at the free end. In operation, the cantilever permits sensing of a force interaction between the tip and the surface of the probed sample. A surface observation made by such an instrument is a function of the sample surface topography and the shape of the tip. To minimize noise, it is desirable not only to make the tip as sharp as possible, but also to make the aspect ratio of the tip as high as possible. The aspect ratio of the tip is an inverse function of the cone angle of the tip. However, as the aspect ratio of a tip is increased, so the tip becomes more fragile and subject to wear. Usually, the shape of the tip is determined by way of tradeoff between the tip robustness and the imaging quality.

An example of a conventional tip assembly comprises a microfabricated cantilever with an integrated silicon tip. While allowing for some economy of scale in production costs over hand-fabricated cantilevers, this technology is nonetheless still relatively expensive. In addition, the silicon tip is subject to wear during normal operation. Wearing of the tip can lead to inconsistent imaging results. Wearing of the tip also makes the tip a consumable of the instrument, introducing a need for regular tip monitoring and replacement time costs. It would be desirable to reduce such monitoring and tip replacement requirements.

WO 99/56176 discloses a method of manufacturing a tipped cantilever comprising forming a tip-like indent in a substrate, depositing a photoresist layer which fills the tip-like indent and covers at least a part of said substrate, and photolithographically structuring the photoresist layer to form the tipped cantilever with tip out of the photoresist. This technique lends itself well to batch microfabrication of plastic cantilevers at a lower cost than the aforementioned silicon technology.

In Review of Scientific Instruments, vol. 70, no. 5, May 1999, pages 2398-2401, G. Genolet et al., "Soft, entirely photoplastic probes for scanning force microscopy", there is disclosed a probe made entirely of plastic material for scanning probe microscopy. A polymer is used for forming the cantilever. The polymer provides mechanical properties that are difficult to achieve with classical silicon technology. The fabrication process is a batch process in which the integrated tip and the lever are defined in one photolithography step.

Applied Physical Letters, vol. 77, no. 21, 20 Nov. 2000, R. Stevens et al., "Improved fabrication approach for carbon nanotube probe devices", discloses an improved process for simple and efficient fabrication of carbon nanotube probe devices. The process requires two steps. First, a nanotube cartridge is created using chemical vapor deposition. Then, the nanotubes are transferred from the cartridge to a device using an electric field.

Carbon nanotube mounted Si and/or silicon nitride tips are commercially available, for example, from PIEZOMAX Technologies Inc. The nanotube is grown and then mounted on such tips manually. The length of the attached nanotube is then iteratively tuned via a series of alternating shortening and re-inspection steps. It will be appreciated that this serial production process is both time consuming, expensive, and unsuitable for batch fabrication. Additionally, the robustness of the tip assembly is governed by the bond between the nanotube and the tip.

In general, the quality and durability of tip assemblies produced according to the aforementioned conventional techniques present limitations is less than optimal for the range of applications now envisaged for such instruments. Furthermore, the reproducibility of such tip assemblies via conventional methods is difficult to achieve without incurring additional cost. It would desirable therefore, as mentioned earlier, to provide microstructures such as tip assemblies of optimal quality, durability and versatility that can be manufactured cheaply.

SUMMARY OF THE INVENTION

In accordance with the present invention, there is now provided a method for forming a microstructure, comprising: depositing a seed material on a substrate; growing a nanotube from the seed material; depositing microstructure material on the substrate to embed the nanotube in the microstructure material; and, detaching the substrate to release the microstructure.

The method preferably further comprises shaping the microstructure material prior to release of the microstructure. The microstructure material may comprise any one of a polymer, a dielectric material, a metal, and polysilicon. The substrate may be formed from any one of Silicon, glass, quartz, ceramics, and plastic. The seed material preferably comprises alternating layers of a first and second precursor materials. The first precursor material preferably comprises a fullerene material, and the second precursor material preferably comprises field sensitive material. The fullerene material may comprise any one of Carbon 60 and Carbon 82, and the field sensitive material may comprise any one of Ni, Co, Fe and Mo. In a preferred embodiment of the present invention, the fullerene material comprises Carbon 60, and the field sensitive material comprises Nickel. The growing of the nanotube preferably comprises: heating the substrate in vacuum conditions; and applying a field to the substrate. The vacuum conditions, in a preferred embodiment of the present invention, comprise oxygen pressure greater than $10^{-5}$ mbar. The heating preferably comprises elevating the temperature of the substrate to between 900 and to 1000 degrees Centrigade. The applied field may comprise a magnetic field. The magnetic field is preferably applied orthogonally to the surface of the substrate. In preferred embodiments of the present invention, the magnetic field is greater than or equal to 50 Gauss. Additionally or alternatively, the applied field may comprise a electric field. The electric field is preferably applied orthogonally to the surface of the substrate. The detaching preferably comprises depositing a sacrificial layer on the surface of the substrate prior to deposition of the cantilever material; and immersing the sacrificial layer in an electrolyte after deposition of the microstructure material. The sacrificial layer preferably comprises an anode sub-layer and a cathode sub-layer. The anode sub-layer may comprise any one of Al, Zn, Cr, Fe, and Co, and the cathode sub-layer comprises a noble metal. The cathode sub-layer may comprise any of Au, Pd, Pt, Ag, and Cu.

In a preferred embodiment of the present invention, the depositing of the seed material comprises: depositing a photo-resist layer on the substrate; forming an aperture in the resist layer; masking the substrate with a resist layer to locate the seed material at a site on the substrate defined by the aperture; and, removing the resist layer to remove surplus seed material. The forming of the aperture preferably comprises under-etching the resist layer to produce a cavity in the resist layer.

Another embodiment of the present invention comprises forming a tip image in a substrate to produce a mold for receiving the microstructure material. The forming of the tip image preferably comprises: depositing a photo-resist layer on the substrate; forming an aperture in the photo-resist layer; and, under etching the substrate beneath the photo-resist layer to create the tip image. The depositing of the seed material preferably comprises: masking the substrate with the resist layer to locate the seed material in the apex of the tip image; and, removing the resist layer to remove surplus seed material.

Viewing the present invention from another aspect, there is provided a microstructure comprising a body portion and a nanotube embedded in the body portion.

The body portion may comprise a cantilever beam with the nanotube embedded in and extending laterally from one end of the beam. Equally or additionally, the body portion may comprise a laterally extending tip with the nanotube embedded in and extending from the apex of the tip. The body portion may comprise any one of a polymer, a dielectric material, a metal, and polysilicon.

It will be appreciated that the present invention extends to a micromechanical sensor comprising a microstructure as hereinbefore described. The present invention also extends to a data storage device comprising an array of such sensors for reading or writing data onto a storage surface.

The present invention advantageously provides a much stronger tip assembly than the conventional tip assemblies herein before described because the nanotube is embedded in the tip material. Another advantage is that the nanotube provides a major improvement in imaging resolution because it offers a smaller apex radius to the surface under analysis. In addition, the nanotube permits imaging of rougher surfaces because it provides an much higher height to width aspect ratio. Furthermore, the nanotube has an electrical resilience, thereby imparting additional robustness and improved contact force to the tip assembly. Still furthermore, a nanotube, as a macromolecule may also provide a predictable platform for tip functionalization by other molecules, such as those of a biochemical nature, allowing the production of scanning probe chemical and biological sensors.

Preferably, the sensor comprises a bundle of nanotubes extending from the apex portion of the tip. The bundle preferably protrudes from the apex portion of the tip. The cantilever beam may comprise any one of photoplastic material, metal, and polysilicon.

The present invention also extends to a data storage device comprising an array of sensors as hereinbefore described for reading or writing data onto a storage surface.

Other advantages of the present invention may be apparent to those skilled in the art based on a perusal of the following description of preferred embodiments.

BRIEF DESCRIPTION OF THE DRAWINGS

Preferred embodiments of the present invention will now be described, by way of example only, with reference to the accompanying drawings, in which.

DETAILED DESCRIPTION OF PREFERRED EMBODIMENTS

An example of a method for fabricating a microstructure according to the present invention will now be described with reference to FIG. 1. The FIG. 1 method will be described with reference to fabrication of a microstructure in the form of a micromechanical cantilever tip assembly having an carbon nanotube crystal embedded in a tip formed from a moldable material. However, it will be appreciated that the method is equally applicable to fabrication of other microstructures having nanotubes embedded therein.

Figure 1A:
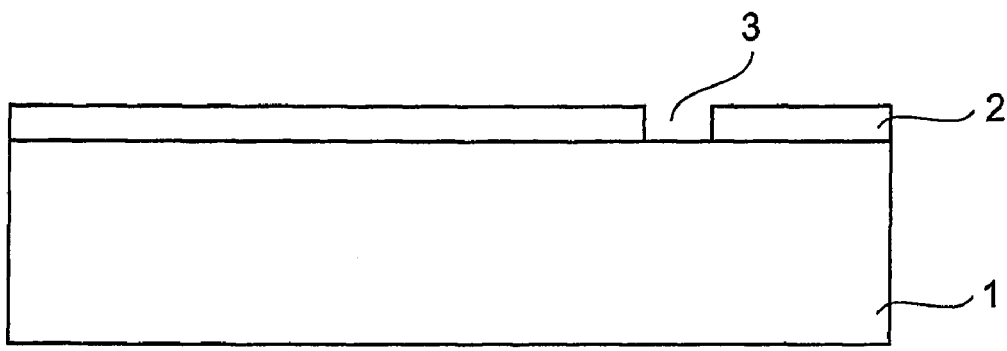
FIGS. 1A to 1J depict steps of a method of fabricating a microstructure according to the present invention.

Referring first to FIG. 1A, a layer 2, of a photoresist material is initially deposited on a substrate 1. In a preferred embodiment of the present invention, the substrate 1 is formed of Silicon. However, in other embodiments of the present invention, the substrate 1 may be formed of a different material, such as glass, quartz, ceramics, plastic, and the like. Other suitable materials will be apparent to those skilled in the art. The photo resist layer 2 is deposited, in a particularly preferred embodiment of the present invention, by spin coating. However, in other embodiments of the present invention, the resist layer 2 may be deposited by a different technique, such as physical vapor deposition or chemical vapor deposition. An aperture 3 of about 300 nm in diameter is opened in the resist layer 2 to expose the underlying Silicon of the substrate 1. In a preferred embodiment of the present invention, the aperture 3 is opened by photolithography. However, it will be appreciated that, in other embodiments of the present invention, different techniques may be employed for opening the aperture 3.

Figure 1B:
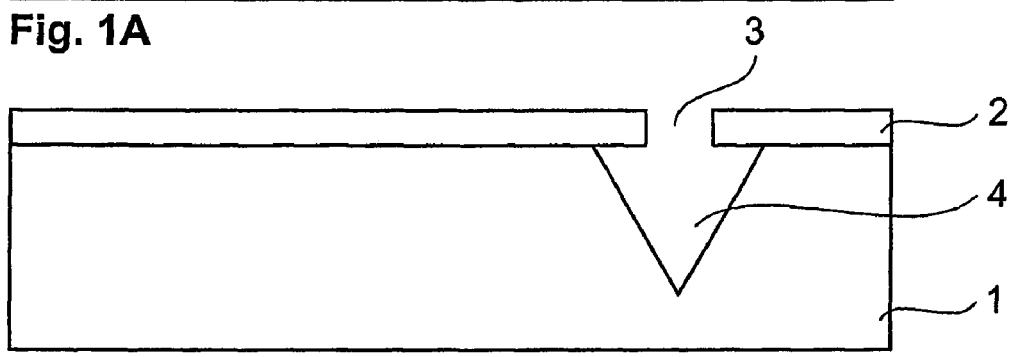

Referring now to FIG. 1B, a conical cavity 4 is then formed in substrate 1 beneath the resist layer 2. The cavity 4 is substantially the image of the tip of the sensor to be produced. In a particularly preferred embodiment of the present invention, the cavity 4 is formed by under-etching the substrate 1 beneath the resist layer 2. Isotropic or anisotropic plasma etching may be employed to provide such under etching. Different techniques for forming the cavity 4 may be employed in other embodiments of the present invention.

Figure 1C:
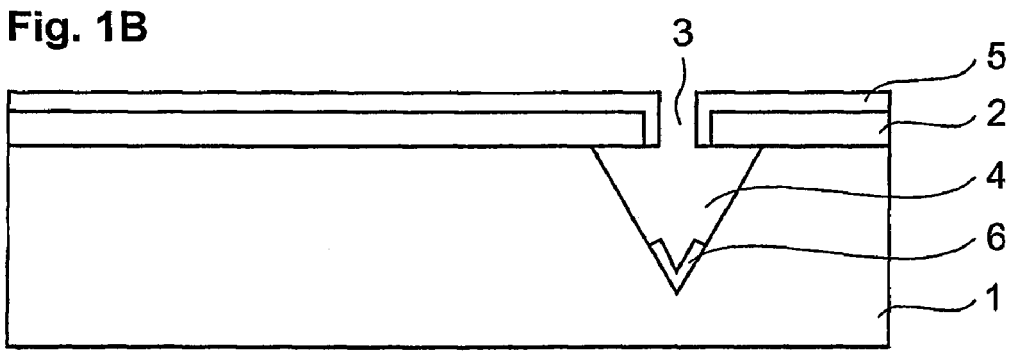

Referring to FIG. 1C, a nanotube seed layer 5 is then deposited on the resist layer 2. In a particularly preferred embodiment of the present invention, the seed layer 5 is deposited by thermal evaporation. However, in other embodiments of the present invention, the seed layer 5 may be deposited by a different technique, such as physical vapor deposition or chemical vapor deposition.

In a preferred embodiment of the present invention in which the substrate 1 is formed from Silicon, a protective layer is disposed at least at the apex of the cavity 4. The protective layer prevents diffusion of materials constituting the seed layer 5 into the substrate 1. In a particularly preferred embodiment of the present invention, the protective layer is formed from Silicon Dioxide. In another preferred embodiment of the present invention, the protective layer is formed from Molybdenum.

The seed layer 5 comprises a first precursor material comprising fullerene molecules such C60, C70, C82, or C116, and a second precursor material comprising a catalyst. In particularly preferred embodiments of the present invention, the first precursor materials comprises fullerene molecule C60 and the catalyst comprises a magnetic material such as one or more metals selected from the group Ni, Co, Fe, Mo.

In preferred embodiments of the present invention, the first and second precursor materials are deposited in alternating layers. Preferably, between five and ten layers of each precursor material are interlaced in this manner. In a particularly preferred embodiment of the present invention, each layer of precursor material has a thickness of between 5 and 30 nm. During deposition of the seed layer 5 by evaporation, the resist layer 2 acts as a shadow mask directing a portion of the seed layer 5 in the form of a pellet 6 to the apex of the cavity 4. Conditions for controlled nanotube growth such as seed material localization and presence of a micron scale defect are thus optimized in the apex of the cavity 4.

The evaporation of the precursor materials may be performed at pressure of around $10^{-9}$ Torr. Control of such evaporation can be achieved via an electromechanical shutter with an in situ balance for monitoring the deposition rate of the precursor materials. The evaporation can be thus regulated such that the thickness of the layers decreases with their distance from the substrate 1. This decreasing thickness increases the yield. Also, the reduction in thickness may also lead to less of the catalyst being transported towards the tip of the growing nanotube crystal. The evaporation of some desirable catalysts, such as Nickel for example, is technically difficult. This difficulty makes it desirable to utilize only the minimum necessary amount for the manufacturing process. Hence the amount of catalyst material can be reduced by the thinner layers. Because the growth of the crystal begins at the base of the pellet 6, less material transport from the layers remote from the substrate 1 occurs with the layers of reduced thickness.

Figure 1D:
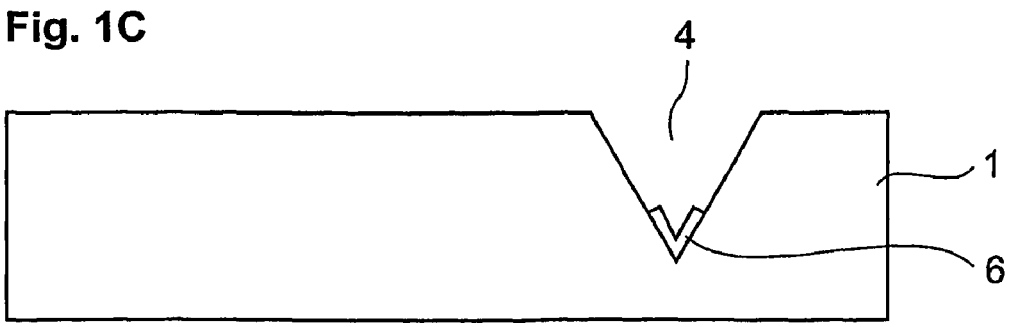

Referring to FIG. 1D, the resist layer 2 is then removed thereby lifting-off the bulk of the seed layer 5. However, the pellet 6 remains in the apex of the cavity 4. In a particularly preferred embodiment of the present invention, the resist layer 2 is removed by wet or dry etching. Different techniques for removing the resist layer 2 may be employed in other embodiments of the present invention. In preferred embodiments of the present invention, the pellet 6 has a diameter of the order of 300 nm. However in other embodiments of the present invention, the seed pellet 6 may have a larger or smaller diameter.

Figure 1E:
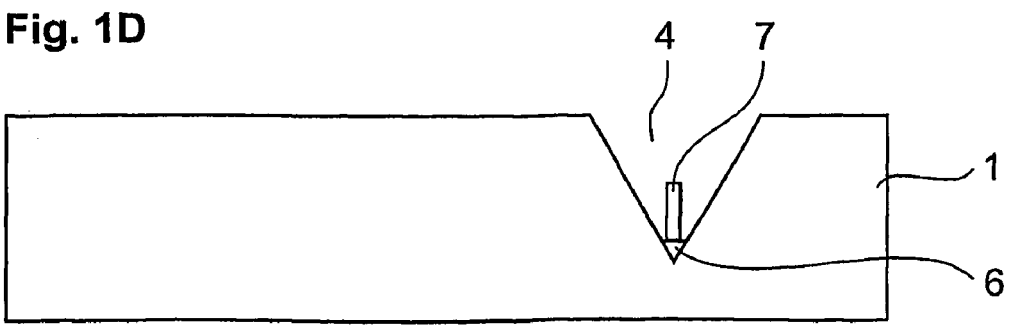

With reference to FIG. 1E, a nanotube crystal 7 is then grown from the pellet 6 at the apex of the cavity 4. The crystal 7 may comprises a bundle of nanotubes or, more preferably, a single nanotube. Growth of the crystal 7 is activated, in preferred embodiments of the present invention, by heating the substrate 1 in vacuum conditions and in the presence of a magnetic or electric field or in combination of magnetic and electric fields. In some embodiments of the present invention, the substrate 1 may be heated in substantially an inert gas atmosphere.

In preferred embodiments of the present invention, the substrate 1 is heated to between 900 and 950 degrees centigrade. The vacuum conditions, in a preferred embodiment of the present invention are provided by a oxygen pressure greater than $10^{-6}$ mbar. In a preferred embodiment of the present invention, the heating is performed in the presence of a magnetic field in the region of 50 Gauss or higher orthogonal to the plane of the substrate 1. The crystal 7 grows in the direction of the applied magnetic field, thus extending in a direction normal to the plane of the substrate 1.

In another embodiment of the present invention, growth of the crystal 7 is performed in the presence of an electric field extending perpendicular to the plane of substrate 1 to promote growth of the crystal 7 in a direction perpendicular to the plane of the substrate 1.

In a particularly preferred embodiment of the present invention, growth of the crystal 7 is stimulated by heating the substrate to 950 degrees centigrade in a vacuum of $10^{-6}$ Torr and in the presence of a perpendicular magnetic field for a period of between around three minutes and around 30 minutes.

Generally, adequate growth can be obtained with a heating time in the minute range. Longer heating does not significantly improve the result. In another preferred embodiment of the present invention, a vacuum of $10^{-9}$ Torr is used.

The dimensions of the pellet 6 determine the total amount of the precursor materials that are involved in the growth of the nanotube crystal 7. The pellet 6 thus provides a reservoir of precursor materials from which the nanotube crystal material is supplied. The predetermination of the material supply in the pellet 6 has the effect that the different precursor materials used in the growth of the nanotube crystal 7 are predetermined in terms of amount and position. The movement of the molecules of the precursor materials is hence confined within the pellet 6, thereby leading to more defined growth and location. The relative concentrations of the precursor materials can affect growth of nanotube crystal 7. Again however, the confinement of the precursor materials in the pellet 6 leads to a more defined ratio between the two precursor materials.

The stronger the applied field, the larger the pellet 6 that can be grown into the crystal 7 because the force that directs the second precursor material is stronger. The shape of the pellet 6 need not be round or square. Other shapes are possible. However, for symmetry reasons a circular shape is preferred. The bundle may range from one to several million nanotubes.

A nucleation site may be placed on the substrate 1 to enable controlled positioning of the nanotube crystal 7. The nucleation site may be created for example by evaporating through the resist layer 2 a material such as tungsten. Because the resist layer 2 has a shadowing effect, an evaporator for the nucleation material, situated sufficiently apart from the evaporators for the precursor materials can automatically generate the nucleation site near the pellet 6. It is desirable to locate the evaporators for the precursor materials as close together as possible to avoid lateral misalignment of the alternate precursor layers in the pellet 6.

As indicated earlier, electromechanical shuttering combined with an in situ quartz crystal micro-balance to monitor deposition rates, may be used to ensure that both fullerene and catalyst materials are evaporated sequentially to produce the desired structure of the pellet 6. This technique produces the pellet 6 at a site determined by the relative position of the aperture 3 and the substrate 1. The choice of substrate 1 can be influenced by the choice of fullerene and catalyst materials.

Acceptable results can be achieved with the substrate 1 being made of Silicon Dioxide or molybdenum in the form of a solid film sputtered on to a Silicon wafer.

In a particularly preferred embodiment of the present invention, after evaporation of a pellet 6 of alternating layers Carbon 60 and Nickel on the substrate 1, the arrangement is heated to 950° C. in a vacuum of $10^{-6}$ mbar for a time which is chosen to lie between a few minutes and an hour. Growth of the resulting nanotubes 7 is oriented normal to the surface of the substrate 1 by immersing the substrate in a magnetic field oriented perpendicular to the substrate surface during heat treatment. A field strength of around 1.5 Tesla achieves desirable results. The application of an electric, electromagnetic or magnetic field directs the self-assembly and organization, of the single-walled carbon nanotubes. The electric field can be an AC or DC field. The electromagnetic field can also be an optical near field such as that of a laser. Also, atomic forces or Van der Waals forces may be applied during growth.

The direction of movement of the second precursor material is governed by the applied field. Hence the field and the second precursor material cooperate in that the second precursor material is moveable by the field. Such a property can be that the second precursor material is magnetic or bears an electric charge or a combination thereof, or has some other property that is influenced by the applied field to exert a moving force.

The nanotube bundle 7 produced in preferred embodiments of the present invention typically has, a diameter between 40 nm and 900 nm with length up to 2 microns. The nanotubes therein are straight are single-wall carbon nanotubes forming straight bundles normal to the substrate. The wall diameters in the bundle are substantially uniform and range from about 1.4 nm to 2.3 nm. There is an inverse correlation between wall and bundle diameter in that small wall diameters are predominant in large diameter bundles whereas large wall diameters are prevalent in small diameter bundles. A typical bundle as a length of about 750 nm and a diameter of between around 20 nm and around 100 nm with a curved end cap, with each nanotube therein having a diameter of around 1.6 nm. The nanotubes are substantially free of inhomogeneity or defect. This remarkable structural perfection is a characteristic of nanotubes produced using the described nanotube growth technique. Further details of this technique are provided in our co-pending patent application reference CH9-2001-0071.

Figure 1F:
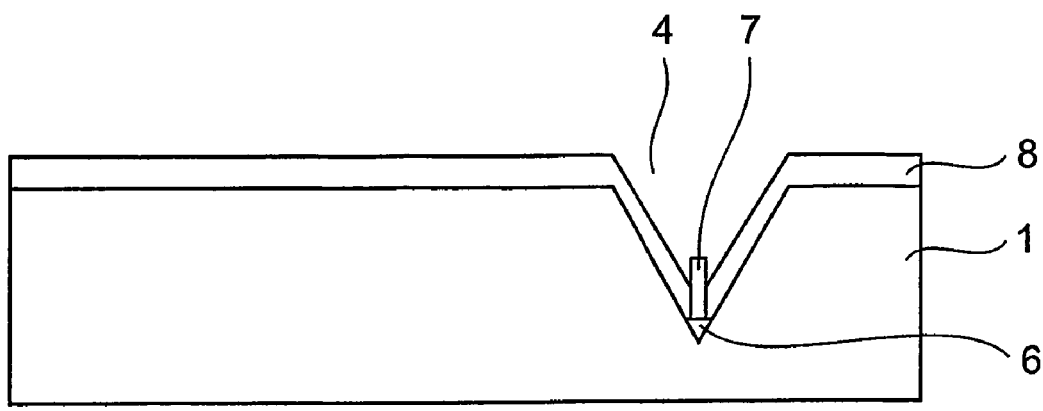

Turning now to FIG. 1F, a sacrificial layer 8 is now deposited on the substrate 1. The sacrificial layer 8 may be deposited by any of a range of techniques, including physical vapor deposition or chemical vapor deposition.

The sacrificial layer 8 comprises two electrically conductive electrode materials having different oxido-reduction potentials. The deposition of the two materials constituting the sacrificial layer 8 is performed in such a way that an electrical contact is present between them. The materials cooperate to form a galvanic cell, with each material forming a different electrode of the cell. The electrode with the higher oxido-reduction potential forms the cathode and the electrode having the lower oxido-reduction potential forms the anode. The cell is of sufficiently high electrochemical potential that one of the materials is electro-etched away when the sacrificial layer 8 is immersed in a suitable electrolyte. In a preferred embodiment of the present invention, the cathode is deposited first, and the anode is subsequently deposited on top of the anode so that the cathode is not released with the sensor to be produced. The electrodes may be formed from a metal or doped semiconductor. The cathode may be provided, in some embodiments of the present invention by the substrate 1.

The electrodes may be formed from metals. Preferably, the cathode comprises a noble metal such as Au, Pd, Pt, Ag, Cu or the like and the anode comprises a metal selected from a group comprising Al, Zn, Cr, Fe, Co or the like, or a doped semiconductor.

The difference between the oxido-reduction potentials of the anode and the cathode should be as large as possible to achieve the maximum electro-etching efficiency. The electrolyte may be introduced in the form of either a liquid or a vapour environment to form a galvanic cell with an electrical potential high enough to etch or enhance the etching of the anode. In a particularly preferred embodiment of the present invention, the electrolyte used is an acidic solution known to etch the anode material. The anode and cathode can be very thin (in the range of about 10 nm) yet nevertheless produce a highly controllable and fast under etching.

Further details of this sacrificial layer release technique are provided in our co-pending patent application reference CH9-2000-0081. An advantage of employing the sacrificial layer release technique hereinbefore described for release of microstructures from moulds is that the technique is well suited to releasing microstructures from pre-structured substrates.

Figure 1G:
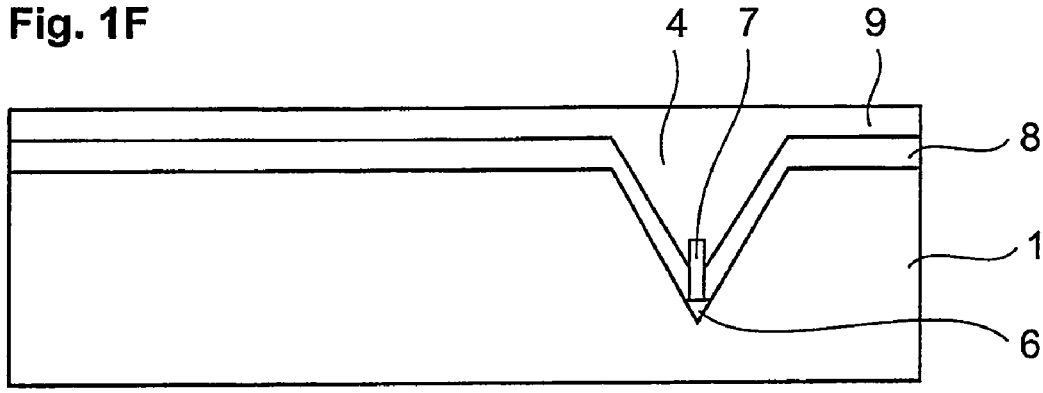
Figure 1H:
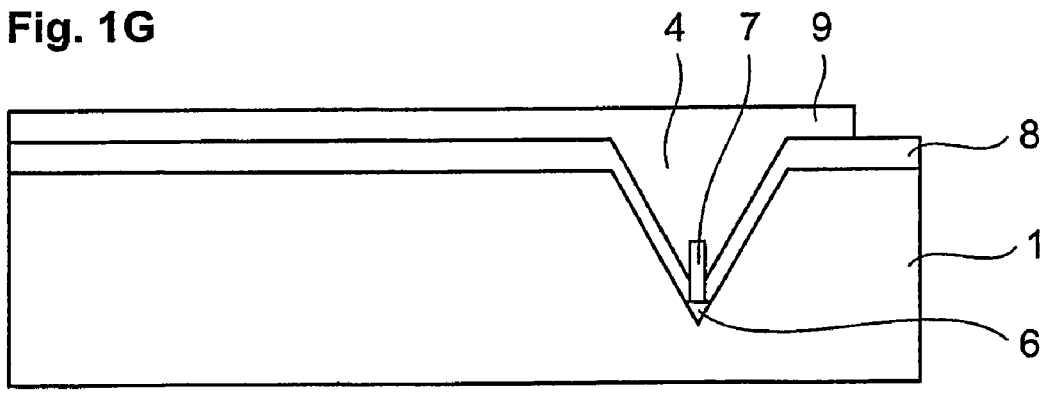
Figure 1I:
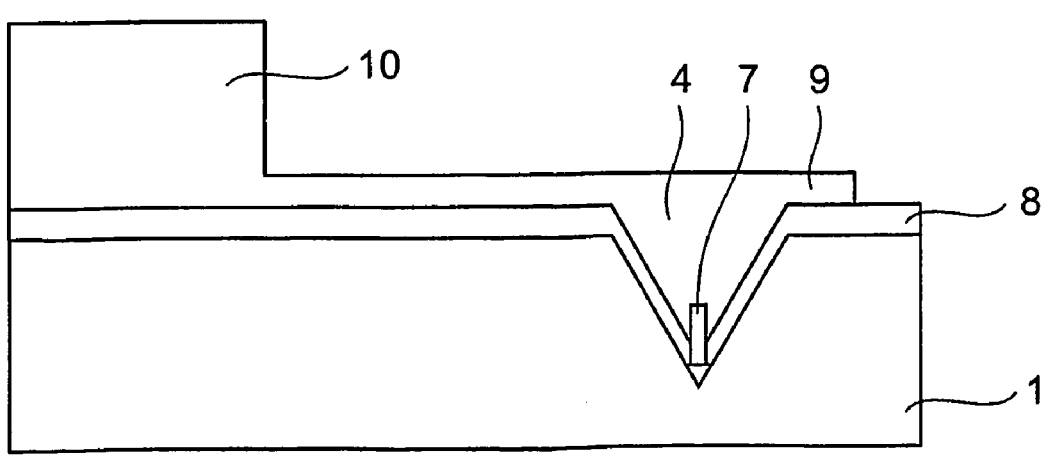

With reference to FIG. 1G, a layer of cantilever material 9 is then deposited onto the sacrificial layer 8. The cantilever material 9 may be deposited by any of a range of techniques, including physical vapor deposition or chemical vapor deposition. Referring to FIG. 1H, the cantilever material is then shaped. Turning to FIG. 1I, a body portion 10 of the cantilever is then deposited on the cantilever layer 9. The body portion is then shaped. The shaping steps hereinbefore described with reference to FIGS. 1H and 1I may be implemented by any of a range of techniques, including lithography, wet etching, and plasma etching.

In preferred embodiments of the present invention, the body portion 10 and the cantilever layer 9 are formed from the same cantilever material. That cantilever material may comprise one or more of a range of materials, such as polymers, dielectric materials, metals, or polysilicon. In particularly preferred embodiments of the present invention, the cantilever material comprises a photo-structurable polymer such as SU-8.

Figure 1J:
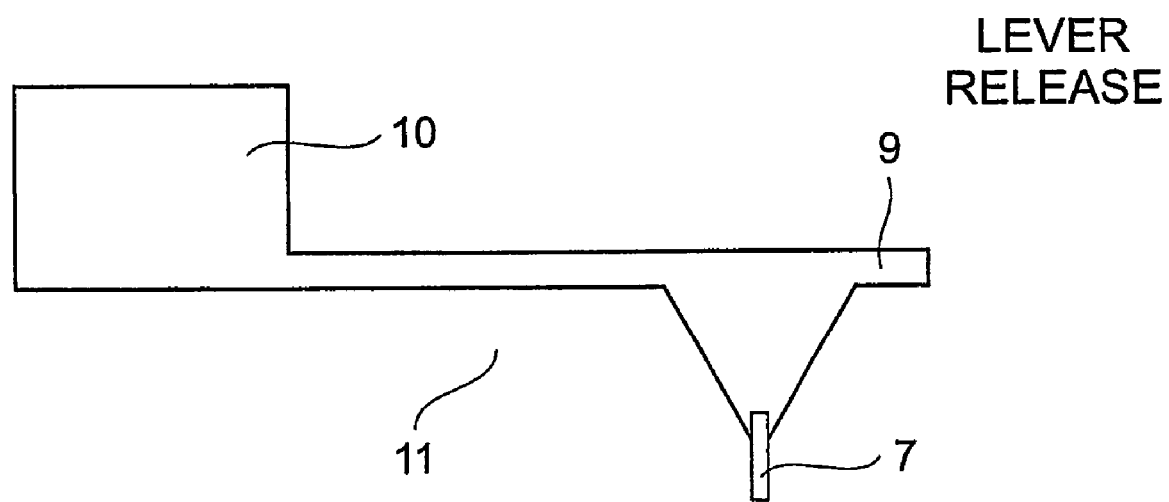

Referring to now FIG. 1J, the completed cantilever 11 is then released from the substrate 1 by immersing the substrate 1 in an electrolyte environment and electro-etching the sacrificial layer 8 as herein before described. This release process exposes an end of the nanotube crystal 7 and leaves the cantilever layer 9 and body 10 unaffected. The thickness of the sacrificial layer 8 determines the length and thus mechanical properties of the nanotube crystal 7. The lateral mechanical rigidity of the nanotube crystal 7 depends on its length and the aspect ratio.

In a preferred embodiment of the present invention hereinbefore described, a sacrificial layer 8 was employed in the release of the cantilever 11. However, in other embodiments of the present invention, other release techniques may be employed. For example, release may also be achieved simply having a adhesion lost while drawing the cantilever 11 out of the substrate 11. The length of the nanotube crystal 7 may be tuned by the thickness of the sacrificial layer 8. Alternatively however, the length of the nanotube crystal 7 may be tuned by depositing a buffer layer (not shown) between the sacrificial layer 8 and the cantilever material 9. The buffer layer is then removed after lift off. In a particularly preferred embodiment of the present invention, the buffer layer is removed by etching, with the cantilever 11 remaining unaffected by the etchant. In another preferred embodiment of the present invention, the buffer layer is omitted and, after liftoff, the cantilever is deliberately thinned down by etchant to expose the embedded nanotube crystal 7.

Another example of a method for fabricating a microstructure according to the present invention will now be described with reference to FIG. 2. The FIG. 2 method is variation of the method hereinbefore described with reference to FIG. 1. In addition, the FIG. 2 method will be described with reference to fabrication of a microstructure again in the form of a micromechanical cantilever tip assembly having an carbon nanotube crystal embedded in a moldable material. However, it will also be appreciated that the FIG. 2 method is equally applicable to fabrication of other microstructures having nanotubes embedded therein.

Figure 2A:
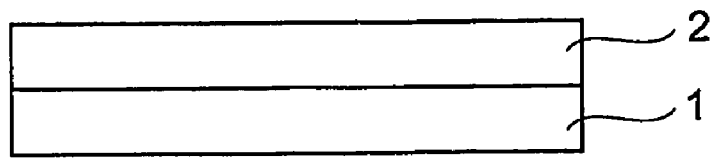
FIGS. 2A to 2I depict steps of another method of fabricating a microstructure according to the present invention; and, FIG. 3 is a block diagram of a local probe storage device including an array of tips.
Figure 2B:
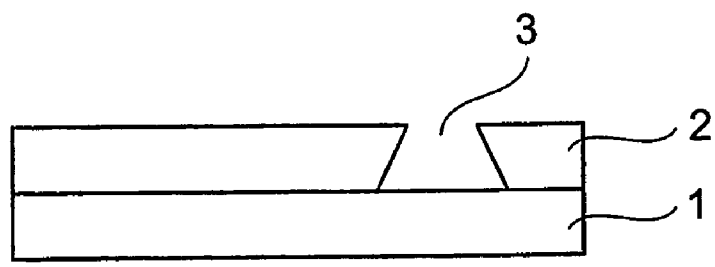

Referring to FIG. 2A, the photo-resist layer 2 is again deposited on the substrate 2.

Turning to FIG. 2B, the aperture 3 is again formed in the resist layer 2 by, for example, exposure and development of the resist layer 2. However, the aperture 3 is now underetched to form a cavity in the resist layer 2 having a necked opening.

Figure 2C:
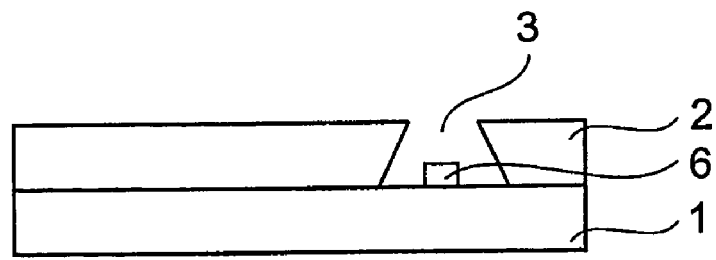

Referring to FIG. 2C, the pellet 6 is now deposited on the substrate 1 via the necked opening in the resist layer 2 using the shadow masking technique hereinbefore described with reference to FIG. 1.

Figure 2D:

Turning to FIG. 2D, the resist layer 2 is then removed from the substrate 2 leaving the pellet 6 remaining on the substrate 2.

Figure 2E:
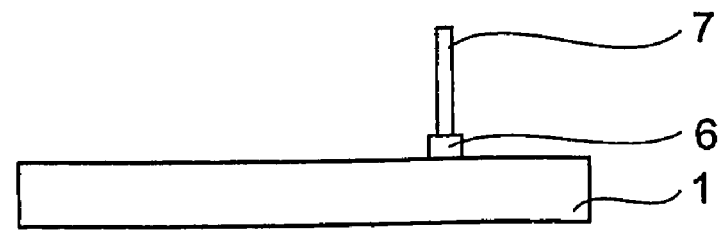

With reference to FIG. 2E, the nanotube crystal 7 is then grown according to the technique hereinbefore described with reference to FIG. 1.

Figure 2F:
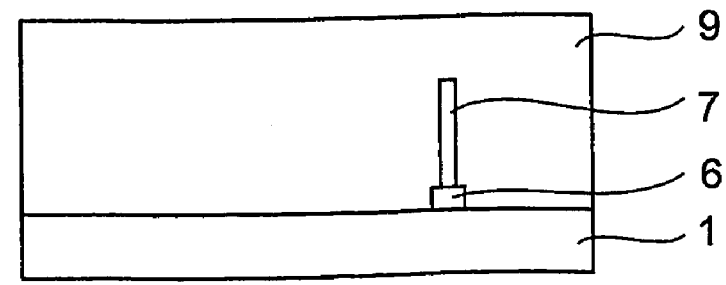

Referring to FIG. 2F, a layer of cantilever material 9 is then deposited on the substrate 1, engulfing the nanotube crystal 7. The cantilever material 9 is preferably deposited by spin coating the substrate 1. In a particular preferred embodiment of the present invention, the cantilever material is a photo-structurable polymer such as SU-8.

Figure 2G:
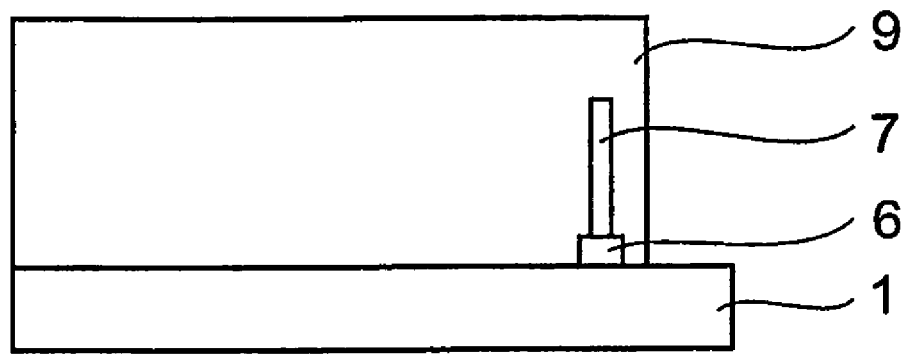

Referring to FIG. 2G, the cantilever material 9 is then structured in situ on the substrate 1.

Figure 2H:
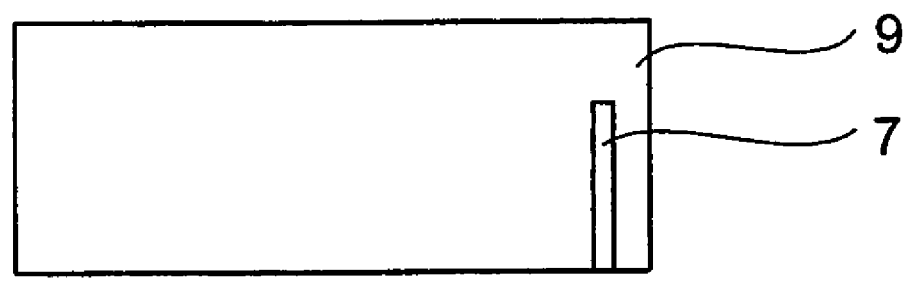

Turning now to FIG. 2H, the cantilever material 9, together with the nanotube embedded therein, is released from the substrate 1. The release of the cantilever material 9 may be effected, for example, by one of the release techniques hereinbefore described with reference to FIG. 1. In the event that sacrificial layer release technique hereinbefore described with reference to FIG. 1 is employed, the sacrificial layer is preferably deposited on the substrate 1 prior to deposition of the resist layer 2 referred to in connection with FIG. 2A.

Figure 2I:
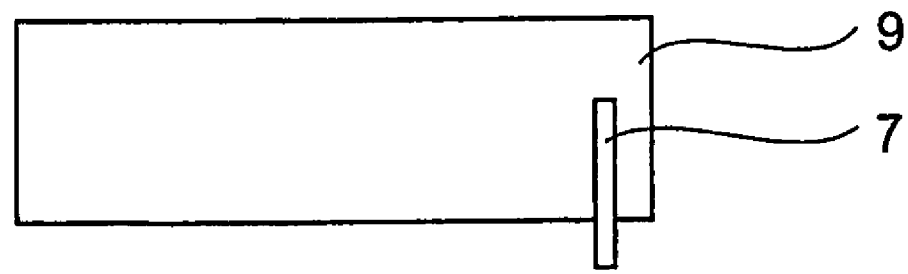

With reference to FIG. 2I, the face of the cantilever material previously in contact with the substrate 1 is now thinned to expose an end of the nanotube crystal 7. The other end of the crystal 78 remains embedded in the cantilever material 9.

Figure 3:
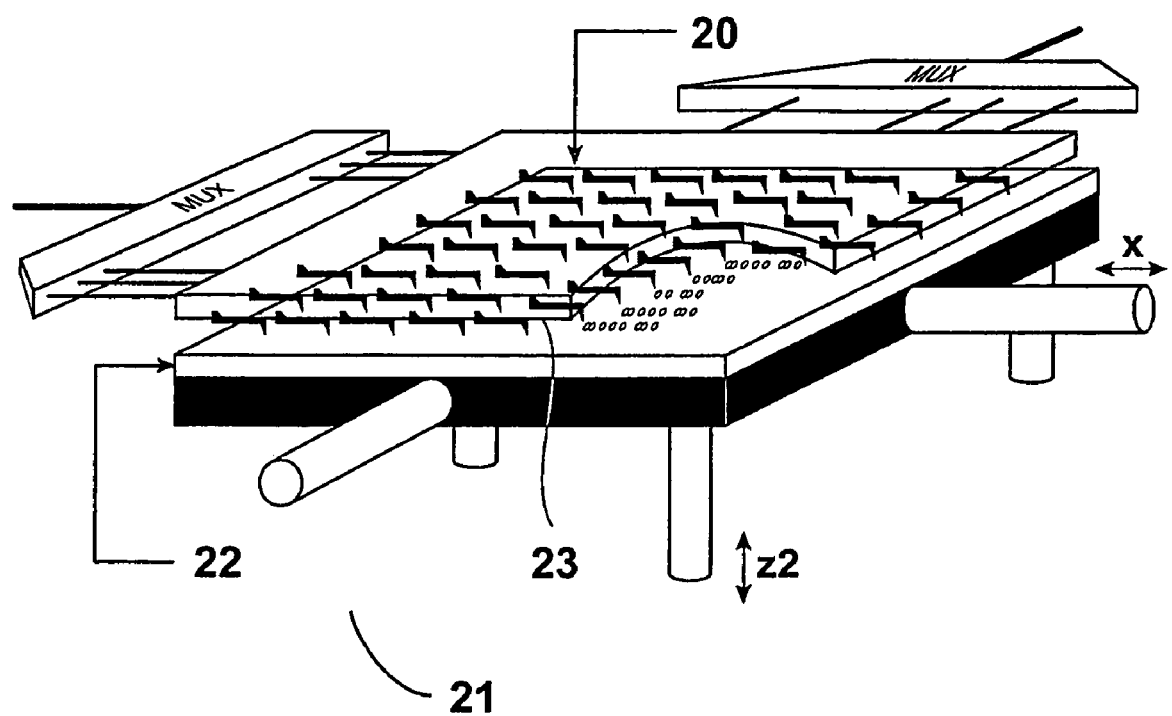

With reference to FIG. 3, a cantilever manufactured according to a method as hereinbefore described may find application in a two dimensional cantilever sensor array 20 for a local probe data storage device 21. In such a device 21, the sensor array 20 is scanned relative to a storage surface 22 in orthogonal directions parallel to the surface 22. Indentations formed in the surface 22 and representative of recorded data are detected by the tips 23 in the array 20 as they are scanned across the surface 22. Equally, the tips 23 can be energized to form indentations in the surface 22 thereby recording data in the surface 22. Further details of such a storage device 21 are provided in the aforementioned Vettiger et al. article. Cantilever sensors produced in accordance with the present invention are especially useful in such storage devices because, having a tip of only few tens of nano-meters in diameter, such tips provide a much higher aspect ratio than conventional tips. The indent dimension made in the polymer will not be wider when using a thicker polymer film (thick polymer film means better read back sensitivity). As for imaging wear of the nanotube will not affect the resolution, leading to the storage density. Also, the thermal conductivity of the nanotube crystal is preferable to that of a silicon tip.

Preferred embodiments of the present invention have been hereinbefore described with reference to microstructures for microscopy and data storage applications. However, it will be appreciated that the present invention is equally applicable to microstructures for a range of other applications. For example, the present invention is equally applicable to charge emissive microstructures such a field emission tips. Such tips may be employed in a range of different application, including display devices.

The invention claimed is:

1. A method for forming a microstructure, comprising:
    depositing a seed material on a substrate;
    growing a nanotube from the seed material;
    depositing microstructure material on the substrate to embed the nanotube in the microstructure material, wherein the microstructure material comprises a different material from the nanotube; and
    detaching the substrate to release the microstructure, wherein detaching comprises depositing a sacrificial layer comprising an anode sub-layer and a cathode sub-layer on a surface of the substrate prior to deposition of the microstructure material.

2. The method as recited in claim 1, further comprising shaping the microstructure material prior to release of the microstructure.

3. The method as recited in claim 1, wherein the microstructure material comprises at least one of a polymer, a dielectric material, a metal, and polysilicon.

4. The method as recited in claim 1, wherein the substrate is formed from one of silicon, glass, quartz, ceramics, and plastic.

5. The method as recited in claim 1, wherein the seed material comprises alternating layers of a first precursor material and a second precursor material.

6. The method as recited in claim 5, wherein the first precursor material comprises a fullerene material, and the second precursor material comprises field sensitive material.

7. The method as recited in claim 6, wherein the fullerene material comprises one of Carbon 60 and Carbon 82, and the field sensitive material comprises at least one of Ni, Co, Fe and Mo.

8. The method as recited in claim 7, wherein the fullerene material comprises Carbon 60, and the field sensitive material comprises Ni.

9. The method as recited in claim 1, wherein growing of the nanotube comprises:
heating the substrate in vacuum conditions; and
applying a field to the substrate.

10. The method as recited in claim 9, wherein the vacuum conditions comprise oxygen pressure greater than $10^{-5}$ mbar.

11. The method as recited in claim 9, wherein heating comprises elevating the temperature of the substrate to between about 900° C. and about 1000° C.

12. The method as recited in claim 9, wherein the applied field comprises a magnetic field.

13. The method as recited in claim 12, wherein the magnetic field is applied orthogonally to a surface of the substrate.

14. The method as recited in claim 13, wherein the magnetic field is greater than or equal to about 50 Gauss.

15. The method as recited in claim 9, wherein the applied field comprises an electric field.

16. The method as recited in claim 14, wherein the electric field is applied orthogonally to a surface of the substrate.

17. The method as recited in claim 1, wherein detaching further comprises:
immersing the sacrificial layer in an electrolyte after deposition of the microstructure material.

18. The method as recited in claim 1, wherein the anode sub-layer comprises one of Al, Zn, Cr, Fe, and Co, and the cathode sub-layer comprises a noble metal.

19. The method as recited in claim 18, wherein the cathode sub-layer comprises one of Au, Pd, Pt, Ag, and Cu.

20. The method as recited in claim 1, wherein depositing of the seed material comprises:
depositing a photoresist layer on the substrate;
forming an aperture in the photoresist layer;
masking the substrate with the photoresist layer to locate the seed material at a site on the substrate defined by the aperture; and
removing the photoresist layer to remove surplus seed material.

21. The method as recited in claim 20, wherein forming of the aperture comprises under-etching the photoresist layer to produce a cavity in the photoresist layer.

22. The method as recited in claim 1, further comprising forming a tip image in the substrate to produce a mold for receiving the microstructure material.

23. The method as recited in claim 22, wherein forming of the tip image comprises:
depositing a photoresist layer on the substrate;
forming an aperture in the photoresist layer; and
under etching the substrate beneath the photoresist layer to create the tip image.

24. The method as recited in claim 23, wherein depositing of the seed material comprises:
masking the substrate with the photoresist layer to locate the seed material in the apex of the tip image; and
removing the photoresist layer to remove surplus seed material.

25. A method for forming a microstructure, comprising:
depositing a seed material on a substrate;
growing a nanotube from the seed material;
depositing microstructure material on the substrate to embed the nanotube in the microstructure material; and
detaching the substrate to release the microstructure, wherein detaching comprises:
depositing a sacrificial layer formed of a different material form the microstructure material on a surface of the substrate prior to deposition of the microstructure material; and
immersing the sacrificial layer in an electrolyte after deposition of the microstructure material.

26. A method for forming a microstructure, comprising:
depositing a seed material on a substrate;
growing a nanotube from the seed material;
depositing microstructure material on the substrate to embed the nanotube in the microstructure material; and
detaching the substrate to release the microstructure, wherein detaching comprises depositing a sacrificial layer formed of a different material from the microstructure material on a surface of the substrate prior to deposition of the microstructure material.

* * * * *